United States Patent [19]
Goser et al.

[11] 4,085,339
[45] Apr. 18, 1978

[54] CIRCUIT ARRANGEMENT IN A COMPLEMENTARY CHL TECHNIQUE

[75] Inventors: Karl Goser; Ruediger Mueller, both of Munich, Germany

[73] Assignee: Siemens Aktiengesellschaft, Berlin & Munich, Germany

[21] Appl. No.: 617,965

[22] Filed: Sep. 29, 1975

[30] Foreign Application Priority Data

Oct. 23, 1974 Germany .................. 2450408

[51] Int. Cl.$^2$ .............. H01L 27/12; H03K 19/08; H03K 19/22
[52] U.S. Cl. .......................... 307/213; 307/218; 307/238; 307/299 B; 357/35; 357/36; 357/44; 357/49
[58] Field of Search .............. 357/35, 36, 44, 46, 357/42; 307/213, 218, 238, 299 B

[56] References Cited

U.S. PATENT DOCUMENTS

| | | | |
|---|---|---|---|
| 3,356,858 | 12/1967 | Wanlass | 357/42 |
| 3,919,765 | 11/1975 | Schloetterer | 357/42 |

OTHER PUBLICATIONS

RCA Cos/Mos Integrated Circuits Manuel, (RCA, Somerville, N.J., 1971), p. 26.
Lehning, "Current Hogging Logic . . .", IEEE J. of Solid State Circuits, vol. 569, No. 5, Oct. 1974, pp. 229-233.

Primary Examiner—William D. Larkins
Attorney, Agent, or Firm—Hill, Gross, Simpson, Van Santen, Steadman, Chiara & Simpson

[57] ABSTRACT

A circuit arrangement CHL technique (current hogging logic) includes individual CHL arrangements each having an emitter, control collectors and an output collector and arranged within an epitaxial layer. The individual CHL arrangements are complementary with respect to one another, and arrangement of one conductivity type being directly integrated in the epitaxial layer and the arrangement which is complementary thereto being integrated in a basin in the epitaxial layer, the basin being doped opposite to the epitaxial layer

8 Claims, 6 Drawing Figures

CIRCUIT ARRANGEMENT IN A COMPLEMENTARY CHL TECHNIQUE

BACKGROUND OF THE INVENTION

1. Field of the Invention

This invention relates to circuit arrangements in CHL technique, and more particularly to such arrangements in which individual CHL arrangements are arranged in an epitaxial layer and each includes an emitter, an output collector and control collectors.

2. Description of the Prior Art

Circuit arrangement in CHL technique are known in the art. They are described, for example, in the publication IEEE International Solid State Circuits Conf. 1974, pp. 18, 19 and 216. These arrangements, however, have a relatively large surface requirement.

Current hogging logic (CHL) functions are implemented by multi-collector pnp (or npn) transistor structures in integrated standard bipolar technology. The basic CHL element has an additional collector zone between the emitter zone and the output collector zone, the additional collector zone constituting a control collector. Under floating conditions, the control collector zone acts as an emitter zone, injecting carriers being collected at the output collector zone. Under the influence of a biasing voltage with respect to the emitter zone, the control collector zone hogs the carriers which were collected by the output collector zone, so that there is only the junction leakage current at the output collector zone. The resulting currents are defined to be the logic variables. Usually, the polarity of the output current is inverted by an output transistor and, according to the present invention, such an output transistor is omitted.

SUMMARY OF THE INVENTION

It is the object of the invention to provide circuit arrangements in a CHL technique which are simple and which can be produced on a small surface.

This object is realized by the way of a circuit arrangement in the initially-mentioned CHL technique which features the disposition of an arrangement of one conductivity type directly in an epitaxial layer and the disposition of an arrangement of the complementary type in an oppositely doped basin located in the epitaxial layer.

An essential advantage of the circuit arrangement constructed in accordance with the invention is that it can be manufactured in a common standard technique and that no additional technological effort is required.

BRIEF DESCRIPTION OF THE DRAWINGS

Other objects, features and advantages of the invention, its organization, construction and operation will be best understood from the following description, taken in conjunction with the accompanying drawings, on which.

DESCRIPTION OF THE PREFERRED EMBODIMENT

Figure 1:
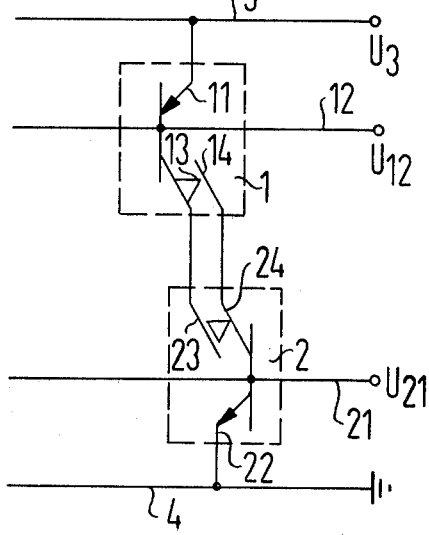
FIG. 1 illustrates a circuit diagram of a bistable flip-flop stage in complementary CHL technique, in accordance with the invention.

Referring to FIG. 1, the construction of a bistable flip-flop stage in accordance with the invention in a CHL technique is illustrated. Two CHL arrangements or transistors which are complementary to one another are referenced 1 and 2, respectively. A p-CHL transistor is employed for the transistor 1, and a n-CHL transistor for the transistor 2. The transistors 1 and 2 are connected, in accordance with the invention, via their collectors 13, 14 and 23, 24 in such a way that a bistable flip-flop stage is produced. The control collector 13 of the transistor 1, which is preferably a pnp transistor, in connected with the output collector 23 of the transistor 2, which is preferably a npn transistor and the control collector 24 of the transistor 2 is connected with the output collector 14 of the transistor 1. A supply voltage $U_3$ is applied between the emitter 22 of the transistor 2 and the emitter 11 of the transistor 1. A pair of supply voltages $U_{12}$ and $U_{21}$ L are provided which are connected to the base terminals 12 and 21, respectively, to supply the required base-emitter voltages for the transistors 1 and 2. A line 4, which is connected with the emitter 22 of the transistor 2, is preferably connected to ground, and a line 3, which is connected with the emitter 11 of the transistor 1, is connected to the voltage potential $U_3$. The circuit operates in such a way that in one of the states the current flows via the collectors 24 and 14 and, in the other state, the current flows via the collectors 23 and 13.

In the above-mentioned IEEE publication, the mode of operation of simple CHL arrangements is explained in detail. In order to construct a bistable flip-flop stage in accordance with this publication, two CHL arrangements with two bipolar vertical transistors would be required which would entail an essentially greater surface requirement.

The mode of operation of the circuit constructed in accordance with the invention and as illustrated in FIG. 1 will be explained in greater detail in connection with FIGS. 2 and 3. Individual features of FIGS. 2 and 3 which have already been explained in connection with FIG. 1 will carry the respective reference numerals. The pnp arrangement 1 is integrated in an epitaxial layer 5. An n-epitaxial layer is therefore of concern for the layer 5. The npn arrangement 2 is arranged in a p-doped basin 25 which is contained in the n-epitaxial layer 5. The line 12 corresponds to the epitaxial layer, and the line 21 corresponds to the doped basin. The entire circuit may be produced in accordance with standard bipolar technology.

In the state in which the current flows via the collectors 13 and 23, a potential will appear at these collectors which is between ground and the applied supply voltage $U_3$. This potential will prevent the emission of charge carriers by the control collector 13 of the npn transistor 1, and the output collector 14 of the transistor 1 may assume a potential corresponding to the control collector 24. By way of a suction removal of the charge carriers injected by the emitter 22, the potential at the collector 24 will charge up, approximately to the potential provided at the emitter 11, so that the collector 24 emits charge carriers, which means that the current flows via the collectors 23 and 13.

In the other state, in which the current flows via the collectors 24 and 14, the complementary potential conditions to the above-mentioned state are provided in the integrated arrangement.

Figure 2:
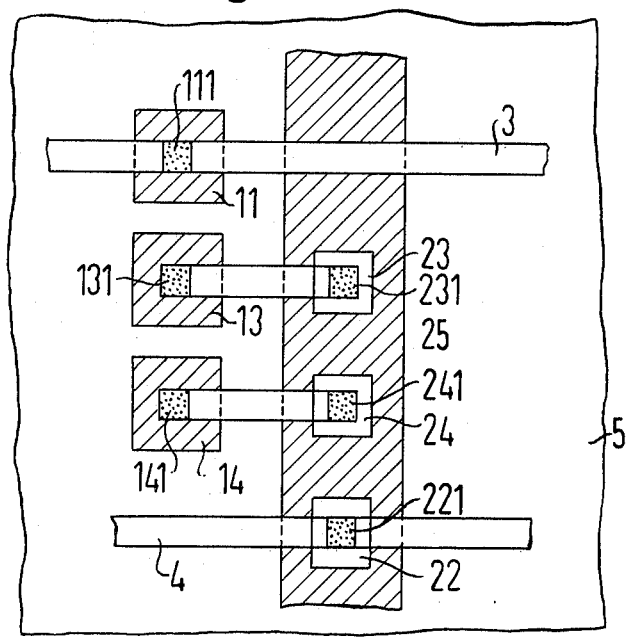
FIG. 2 is a schematic layout of the flip-flop circuit illustrated in FIG. 1.
Figure 3:
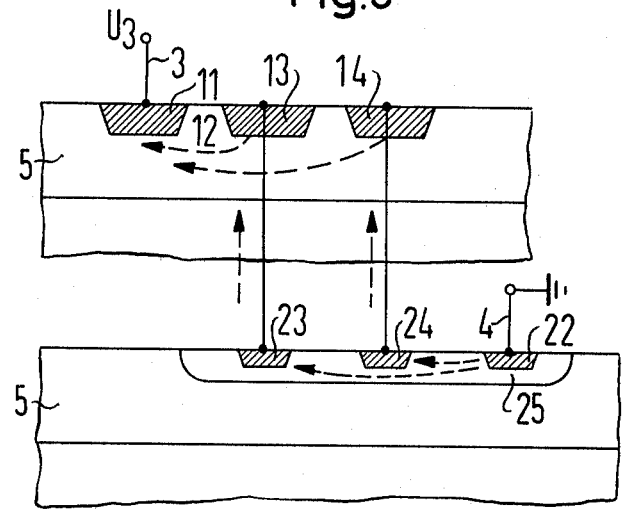
FIG. 3 is a cross section through the layout shown in FIG. 2 with the path of the currents for the stable states illustrated in broken lines.
Figure 4:
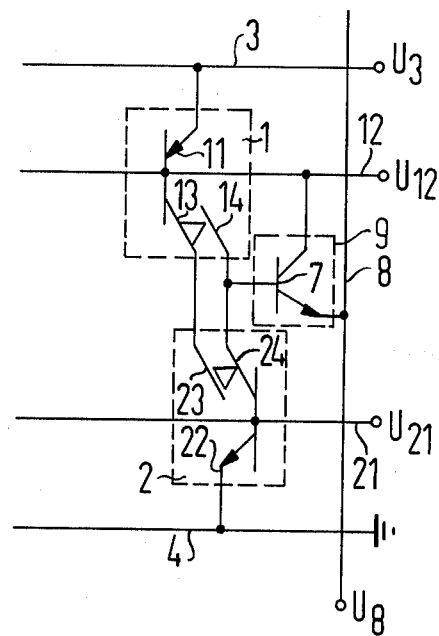
FIG. 4 illustrates a circuit diagram for a memory element constructed in accordance with the invention.

The bistable flip-flop circuit in accordance with FIGS. 1-3 may be extended to become a memory element, if the required selection elements 9 are provided, as illustrated in FIG. 4. For this purpose, different possibilities may be employed. A diode, for example, may serve as a selection element, or a transistor 7 may be provided for that purpose. The circuit diagram of a memory element having selection via a transistor 7 is illustrated in FIG. 4. Individual features of FIG. 4 which have already been described in connection with the other figures, carry corresponding reference numerals. The transistor 7 is directly integrated into the collector 14. The selection of the element is effected via a base line which serves as a working line. The emitter terminal of the selection transistor 7 is connected to the emitter terminals of the other selection transistors by way of a bit line 8, whereby such other selection transistors are arranged at the same bit line.

Figure 5:
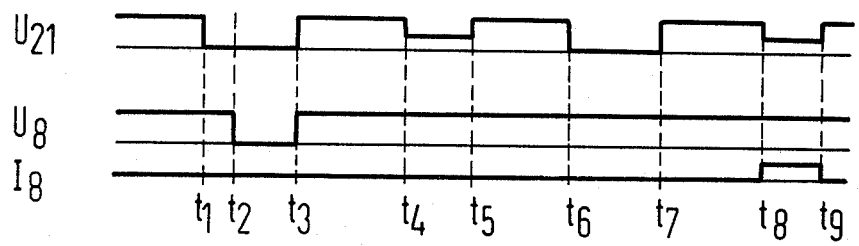
FIG. 5 is a pulse diagram for reading and writing in the circuit in accordance with FIG. 4.

In accordance with the pulse diagram of FIG. 5, the base-emitter diode of the selection transistor 7 is blocked in the unselected state. During read-out, the state of the bistable flip-flop circuit is scanned without destroying the stored information. As can be seen from the diagram of FIG. 5, the potential on the word line 21 is somewhat lowered for read-out (time duration $t_4$–$t_5$ and $t_8$–$t_9$). Therefore, the transistor 2 becomes less conductive. If, for example, the branch 14, 24 carries current, the potential at the point of intersection increases, so that the selection transistor 7 becomes conductive and the potential on the bit line 8 is increased. If, however, the branch 13, 23 is conductive, the selection transistor is not influenced, since the point 24 remains at a lower potential.

During the writing process, the memory element may be placed in the unselected position due to the selection transistor being switched into the conductor state. In FIG. 5, the writing process is illustrated in the time period $t_1$–$t_3$. First of all, the selection transistor 7 is placed into the conductive state by applying corresponding potentials to the bit line 8 and to the word line 21 at the same time instant $t_1$, for example, the potential 0 V being applied to the word line 21. At the instant $t_2$, for example, the potential 1 V is applied to the bit line 8.

Figure 6:
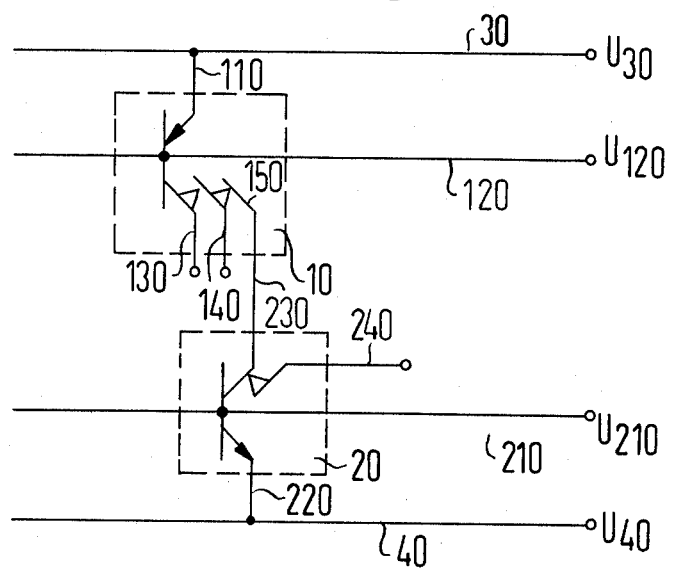
FIG. 6 shows a circuit arrangement of an OR gate in a complementary CHL technique in accordance with the invention.

In the case of complementary CHL arrangements, it is also possible to construct logic circuits. Such a logic circuit constructed in accordance with the invention is illustrated in FIG. 6. For example, the control collectors 130 and 140 of the arrangement 10 are employed as inputs and the collector 240 of the lower arrangement as an output. In the case of the complementary CHL arrangements constructed in accordance with the invention, one is concerned with non-inverted logic wherein AND and OR gates may be realized in an advantageous manner. In the common CHL technique, however, NAND and NOR gates would result.

As opposed to the common arrangement, as it has been described in the above-identified literature, arrangements constructed in accordance with the invention provide essential space savings and more flexible possibilities in circuit techniques.

Advantageously, arrangements constructed in accordance with the invention are constructed in a SOS technique, whereby silicon layers are arranged upon an insulating substrate, which preferably consists of spinel or sapphire. The individual arrangements are integrated into the silicon layers.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A current hogging logic circuit arrangement comprising:
   a body of semiconductor material having a first portion of a first conductivity type and a second portion of a second conductivity type;
   a first multi-collector bipolar transistor formed in said first portion of said body, said first portion of a first conductivity type forming the base region of said first transistor, a first emitter region of second conductivity type formed in said first portion, a first output collector region of second conductivity type formed in said first portion spaced from said first emitter region, and a first control collector region of second conductivity type formed in said first portion, said first control collector region located between and spaced from said first emitter region and said first output collector region, a second multi-collector bipolar transistor formed in said second portion of said body, said second portion of said second conductivity type forming the base region of said second transistor, a second emitter region of first conductivity type formed in said second portion, a second output collector region of said first conductivity type formed in said second portion spaced from said second emitter region, and a second control collector region of first conductivity type formed in said second portion spaced from said second emitter region, said second control collector region located between and spaced from said second emitter region and said second output collector region;
   means for forward-biasing the pn junction between said first portion and said first emitter region; and
   means for forward-biasing the pn junction between said second portion and said second emitter region, said first control collector region being directly connected to said second output collector region, whereby current flow through said first output collector region may be controlled by controlling current flow through said second control collector region.

2. A current hogging logic circuit arrangement according to claim 1, constructed as a flip-flop, comprising
   a direct connection between said first output collector region and said second control collector region.

3. A current hogging logic circuit arrangement, according to claim 1, wherein said body of semiconductor material is an epitaxial silicon layer carried on an insulating substrate.

4. A current hogging logic circuit arrangement according to claim 1, comprising:
   a selection element connected to said output collector region of said first transistor and said control collector region of said second transistor; and
   a bit line connected to said selection element.

5. A current hogging logic circuit arrangement according to claim 4, wherein said selection element comprises a transistor having a base connected to said output collector zone of said first transistor, a collector connected to said base region of said first transistor, and an emitter connected to said bit line.

6. A current hogging logic circuit arrangement according to claim 4, wherein said selection element comprises a diode having an anode connected to said output collector region of said first transistor and a cathode connected to said bit line.

7. A current hogging logic circuit arrangement according to claim 1, wherein said body of semiconductor material comprises an epitaxial silicon layer carried on an insulating substrate, said epitaxial layer is an n-epitaxial layer, said first transistor is a pnp transistor, and said second transistor is an npn transistor.

8. A current hogging logic circuit arrangement according to claim 1, wherein said body of semiconductor material comprises an epitaxial silicon layer carried on an insulating substrate, wherein said epitaxial layer is a p-epitaxial layer, said first transistor is an npn transistor, and said second transistor is a pnp transistor.

* * * * *